United States Patent [19]

Takenouchi

[11] Patent Number: 5,399,809
[45] Date of Patent: Mar. 21, 1995

[54] MULTI-LAYER LEAD FRAME FOR A SEMICONDUCTOR DEVICE

[75] Inventor: Toshikazu Takenouchi, Nagano, Japan

[73] Assignee: Shinko Electric Industries Company, Limited, Nagano, Japan

[21] Appl. No.: 67,076

[22] Filed: May 26, 1993

[30] Foreign Application Priority Data

May 29, 1992 [JP] Japan ................. 4-163752

[51] Int. Cl.⁶ .................. H05K 1/00; H01L 23/02
[52] U.S. Cl. .................. 174/84 R; 174/52.4; 174/88 R; 174/261; 257/690
[58] Field of Search ......... 174/84 R, 88 R, 52.4, 174/260, 261; 257/690

[56] References Cited

U.S. PATENT DOCUMENTS

| | | | |
|---|---|---|---|
| 3,597,834 | 8/1971 | Lathrop et al. | 29/576 R |
| 3,848,077 | 11/1974 | Whitman | 174/52.4 |
| 4,113,981 | 9/1978 | Fujita et al. | 174/88 R |
| 4,925,024 | 5/1990 | Ellenberger et al. | 174/52.4 |
| 5,025,114 | 6/1991 | Braden | 174/52.4 |
| 5,180,888 | 1/1993 | Sugiyama et al. | 174/84 R |
| 5,183,969 | 2/1993 | Odeshima | 174/88 R |
| 5,262,226 | 11/1993 | Yoshida | 174/88 R X |

FOREIGN PATENT DOCUMENTS 3-266306 11/1991 Japan.
91/06978 5/1991 WIPO.

OTHER PUBLICATIONS

IBM Technical Disclosure Bulletin, vol. 33, No. 10A, Mar. 1991, New York, NY, "Flatpack Package Using Core Metal Layer of Composite Substrate as Ground Plane," pp. 450–451.

*Primary Examiner*—Morris H. Nimmo
*Attorney, Agent, or Firm*—Staas & Halsey

[57] ABSTRACT

A multi-layer lead frame for a semiconductor device includes a signal layer made of a metal strip having a signal pattern including a plurality of lead lines. A power supply or ground layer is adhered and laminated to the signal layer by means of an adhesive film. The adhesive film is an electrically insulation connector tape having through holes extending in a thickness direction. Conductive metal vias are filled in the through holes for electrically connecting the power supply or ground layer particular leads among the plurality of lead lines.

10 Claims, 2 Drawing Sheets

MULTI-LAYER LEAD FRAME FOR A SEMICONDUCTOR DEVICE

BACKGROUND OF THE INVENTION

1. Field of the Invention

This invention relates to a lead frame and, particularly, to a multi-layer lead frame having at least one metal plate or plane which is used for a semiconductor device.

2. Description of the Related Art

A conventionally known multi-layer lead frame for a semiconductor device comprises at least one metal plane connected via an insulation layer to the bottom surface of inner leads. The use of such a multi-layer lead frame enables the mounting of a relatively high-power semiconductor chip on the metal plane, due to heat dispersion from the metal plane. Also, the metal plane can be used as a ground layer or a power-supply layer to improve the electrical characteristics of the semiconductor device.

FIG. 6 shows a conventionally known multi-layer lead frame which includes three layers, i.e., a signal layer 5, a power supply layer 6 and a ground layer 7, which are affixed or laminated to each other, in turn, by means of electrically insulation films 8 and 8, respectively, made of, for example, polyimide.

In the illustrated example, the lowermost layer formed as the ground layer 7 and the intermediate layer formed as the power supply layer 6 can be connected to a ground voltage and a power voltage, respectively, by means of bonding-wires extended from the optional positions of a semiconductor chip to the ground layer 7 and the power supply layer 6, respectively, since these layers are formed as planes.

In order to connect the power supply layer 6 and the ground layer 7 to the power voltage and the ground voltage, respectively, the power supply layer 6 and the ground layer 7 are provided with respective projections or electrodes 9 and 10 protruded from the outer edges thereof for electrically connecting them to the power supply leads and the ground leads, respectively, of the signal layer 5 by such as a resistance welding or the like. In practice, a plurality of such projections or electrodes 9 and 10 are formed substantially equidistantly on the power supply layer 6 and the ground layer 7, respectively. These projections 9 and 10 are preformed on the power supply leads and the ground leads, respectively, so as to accurately align with a plurality of power supply and ground leads, respectively, of the signal layer 5.

However, a process of resistance welding for connecting the electrodes 9 and 10 of the power supply layer 6 and the ground layer 7 to the power supply leads and the ground leads of the signal layer 5 is quite different from a process for adhering the signal layer 5, the power supply layer 6 and the ground layer 7 together so as to form a laminated layer and, therefore, such a process needs a special welding apparatus for the purpose. Thus, more laborious works is required. In addition, when resistance welding is conducted, it is difficult to obtain a fully sufficient uniformity in stability and strength of welding. Therefore, it is sometimes difficult to obtain a necessary strength of welding or a good appearance.

SUMMARY OF THE INVENTION

An object of the present invention is to provide a multi-layer lead frame used for a semiconductor device, in which an electrical connection between the signal layer and the power supply layer or the ground layer can stably be attained without using a resistance welding process.

Another object of the present invention is to provide a multi-layer lead frame used for a semiconductor device, in which the signal layer and other metal planes can easily be laminated together to form a multi-layer.

According to one aspect of this invention, there is provided a multi-layer lead frame for a semiconductor device comprising: a signal layer made of a metal strip having a signal pattern including a plurality of lead lines; at least one metal layer adhered and laminated to said signal layer by means of an adhesive film; said adhesive film being an electrical insulation connector tape having through holes extending in a thickness direction thereof; and conductive metal vias filled in said through holes for electrically connecting said metal layer to one or more particular leads among said plurality of lead lines.

According to another aspect of the present invention, there is provided a multi-layer lead frame for a semiconductor device comprising: a signal layer made of a metal strip having a signal pattern including a plurality of lead lines; a first metal layer adhered and laminated to one of both surfaces of said signal layer by means of a first adhesive film; a second metal layer adhered and laminated to the other surface of said signal layer by means of a second adhesive film; said first and second adhesive films being electrical insulation connector tapes each having through holes extending in a thickness direction thereof; and conductive metal vias filled in said through holes for electrically connecting said first and second metal layers to one or more first and second particular leads, respectively, among said plurality of lead lines.

DESCRIPTION OF THE PREFERRED EMBODIMENTS

Referring now to the accompanying drawings, some preferred embodiments according to the present invention will now be described in detail.

Figure 1:
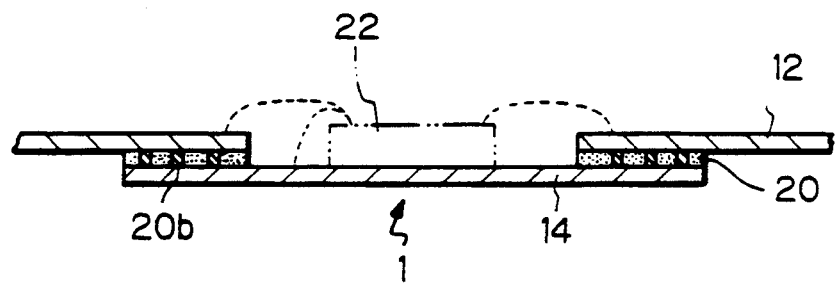
FIG. 1 is a cross-sectional view of a first embodiment of a multi-layer lead frame according to the present invention.

In FIG. 1, a first embodiment of a multi-layer lead frame according to the present invention is shown. A multi-layer lead frame of this embodiment generally indicated by a reference numeral 1 has a two-layer structure and comprises a signal layer 12 and a power supply layer 14. In the same manner as a conventional single layer lead frame, the signal layer 12 is provided with a certain lead pattern including a plurality of signal leads, as well as at least one power supply lead and at least one ground lead, which are arranged in a prescribed manner.

Figure 5:
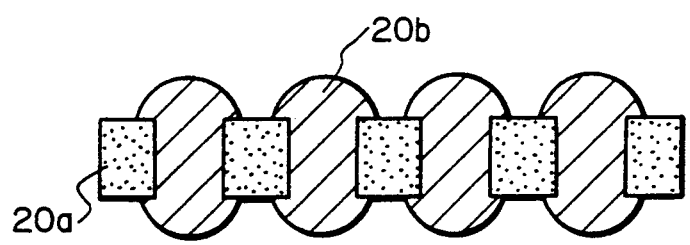
FIG. 5 is a view of a connector tape.
Figure 6:
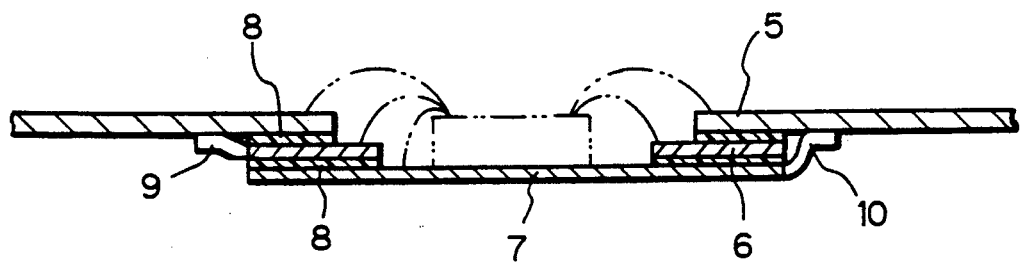
FIG. 6 is a cross-sectional view of a multi-layer lead frame known in the prior art.

The signal layer 12 and the power supply layer 14 are mutually laminated together through a connector tape 20 made of an electrically insulation film provided with some metal vias. As shown in FIG. 5, the connector tape 20 comprises an insulation film 20a provided with via holes extending in the thickness direction of the film 20a and metal filled in the via holes to form electrically conductive metal vias 20b, made of such as Nickel. It is advantageous that gold is plated on such nicked metal vias. The upper and lower ends of each metal via 20b protrude slightly from the upper and lower film surfaces of the insulation film 20a, respectively, to form metal bumps.

The adhesive insulation film 20a is made of, such as, polyimide having an electrically insulation characteristic and a thermal adhering characteristic by applying thereto a heat and a pressure.

The metal vias 20b filled in the via holes of the connector tape 20 can advantageously be formed as fine and small sized as possible, in such a manner that, for example, a diameter of each metal via 20a is about 25 μm (generally, 20–100 μm) and a pitch or a distance to adjacent metal via is about 45 μm. The positions of the via, through holes, in which the metal via should be filled, can be precisely controlled, since these holes can be formed by applying a laser beam (examiner laser) or the like to the adhesive insulation film 20a. The number and the size of such metal vias 20b (via holes) can be selected suitably.

The connector tape 20 is formed as a frame shape so as to conform with a size of the power supply layer 14 and a region of adhesion to the signal layer 12, as shown in FIG. 1, and the connector tape 20 is thus used to adhere the signal layer 12 with the power supply layer 14.

Figure 2:
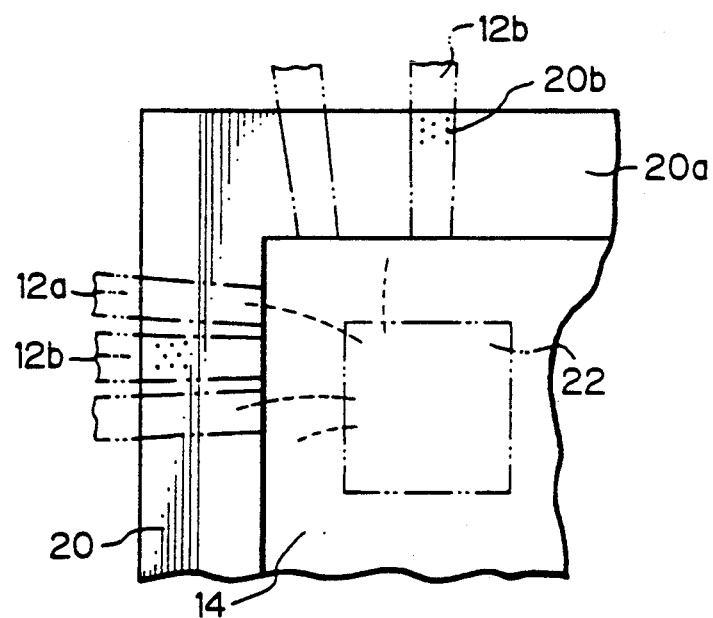
FIG. 2 is a plan view illustrating a connector tape, a signal layer and the like used in the multi-layer lead frame of this invention.

FIG. 2 is a plan view of the connector tape 20 to which the respective inner leads 12a of the signal layer 12 are adhered, as shown. The connector tape 20 is provided in advance with metal vias 20b at the positions where the power supply leads 12b among the inner leads 12a are to be adhered.

Since the metal via 20b can be made small, a plurality of such metal vias 20b can be formed within the width of a single power supply lead 12b. The remaining area of the connector tape 20 other than the portions, to which the power supply leads 12b are to be adhered, is a film area with no such vias.

Figure 3:
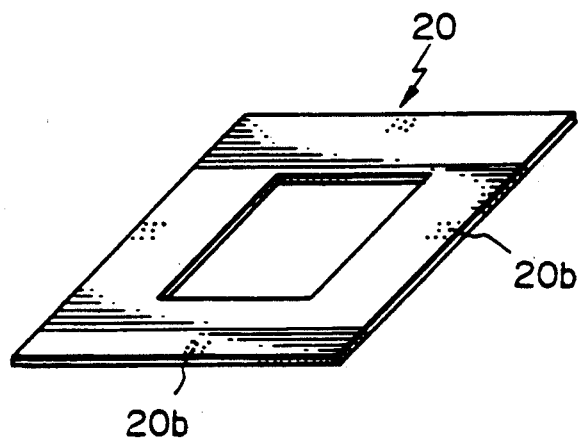
FIG. 3 is a perspective view of a connector tape.

FIG. 3 is a perspective view of the connector tape 20 made of an insulation film provided with the metal vias 20b. As mentioned above, the metal vias 20b are formed at the positions corresponding to the arrangement of the power supply leads 12b of the signal layer 12. When the signal layer 12 is laminated with the power supply layer 14, the connector tape 20 is inserted so as to be located in a prescribed position between the signal layer 12 and the power supply layer 14 and then pressure with heat is applied for a necessary time period.

Since the connector tape 20 is provided with the metal vias 20b extending in the direction of thickness thereof as shown in FIG. 5, when the signal layer 12 and the power supply are adhered to each other with pressure and heat, the upper and lower ends of each metal via 20b come in contact with the power supply leads of the signal layer 12 and the power supply layer 14, respectively, so that the power supply leads are electrically connected to the power supply layer 14 through the metal vias 20b. Since a plurality of such metal vias 20b are arranged within a width of a single power supply lead, the power supply leads are electrically connected to the power supply layer 14 through a plurality of metal vias 20b and thus an electrical connection therebetween is maintained.

As a certain voltage can thus be applied to the power supply layer 14, a semiconductor chip 22 can be mounted on the power supply layer 14 and then electrically connected to the power supply layer 14 by means of bonding-wires, as shown in FIG. 1.

According to the method as mentioned above, when the signal layer 12 and the power supply layer 14 are mutually adhered to each other, an electrical connection between the power supply leads and the power supply layer 14 can simultaneously be accomplished. Consequently, a resistance welding for the projections protruded from the power supply layer in the prior art is no longer necessary. Therefore, a multi-layer lead frame can easily be manufactured.

Although the above-mentioned embodiment concerns to a multi-layer lead frame comprising a signal layer and a power supply layer, a same method can also be applied for a multi-layer lead frame having a ground layer in place of the power supply layer. In this case, a connector tape should be provided with metal vias at positions corresponding to the arrangement of the ground leads of the signal layer and then the signal layer and the ground layer are mutually adhered to each other through the connector tape, in the same manner as mentioned above.

Figure 4:
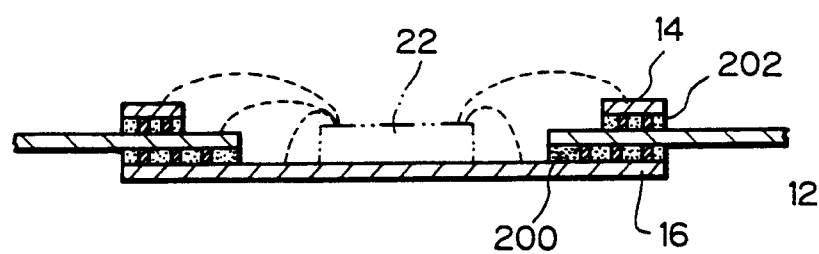
FIG. 4 is a cross-sectional view of a second embodiment of a multi-layer lead frame of this invention.

FIG. 4 shows a second embodiment of the present invention, in which a multi-layer lead frame has a three-layer structure and comprises a signal layer 12, an upper, power supply layer 14, and a lower, ground layer 16. In this embodiment, the signal layer 12 is arranged as an intermediate layer, and the power supply layer 14 and the ground layer 16 are arranged as upper and lower layers thereof, respectively. Between the signal layer 12 and the ground layer 16 and between the power supply layer 14 and the signal layer 12 arranged are respective connector tapes 200 and 202 for adhering and laminating them together.

The connector tape 200 for adhering the signal layer 12 with the ground layer 16 is provided with metal vias at positions corresponding to the arrangement of ground leads of the signal layer. On the other hand, the connector tape 200 for adhering the power supply layer 14 with the signal layer 12 is provided with metal vias at positions corresponding to the arrangement of power supply leads of the signal layer 12. Thus, when the signal layer 12, the power supply layer 14 and the ground layer 16 are positioned to each other and laminated together with heat and pressure, a three-layer lead frame can simultaneously be formed.

In the same manner as the previous embodiment, when the signal layer 12, the power supply layer 14 and the ground layer 16 are laminated, an electrical connection therebetween can simultaneously be accomplished. Therefore, a multi-layer lead frame can effectively be manufactured.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

I claim:

1. A multi-layer lead frame for a semiconductor device comprising:
   a signal layer having a signal pattern including a plurality of lead lines each formed of a metal strip;
   at least one metal layer adhered and laminated to said signal layer by means of a self-adhesive connector film;
   said connector film being an electrically insulating polymer tape having through holes extending in a thickness direction thereof; and
   conductive metal vias formed in said through holes for electrically connecting said metal layer to one or more particular leads among said plurality of lead lines.

2. A multi-layer lead frame as set forth in claim 1, wherein said metal layer is a power supply layer and said one or more particular leads are power supply leads which are electrically connected to said power supply layer by means of said metal vias.

3. A multi-layer lead frame as set forth in claim 1, wherein said metal layer is a ground layer and said one or more particular leads are ground leads which are electrically connected to said ground layer by means of said metal vias.

4. A multi-layer lead frame as set forth in claim 1, wherein said particular lead has a certain width, in which a plurality of said metal via are arranged.

5. A multi-layer lead frame as set forth in claim 1, wherein, before said connector film is used to laminate said signal layer with said metal layer, upper and lower ends of said conductive metal vias filled in said through holes protrude upward and downward from upper and lower surfaces of said connector film.

6. A multi-layer lead frame as set forth in claim 1 wherein said connector film is polyimide.

7. A multi-layer lead frame as set forth in claim 1 wherein said connector film is self-adhesive upon application of heat and pressure.

8. A multi-layer lead frame for a semiconductor device comprising:
   a signal layer having first and second surfaces having a signal pattern including a plurality of lead lines each formed of a metal strip;
   a first metal layer adhered and laminated to said first surface of said signal layer by means of a first connector film;
   a second metal layer adhered and laminated to said second surface of said signal layer by means of a second connector film;
   said first and second connector films being electrically insulating polymer tapes each having through holes extending in a thickness direction thereof, wherein at least one of said first and second connector films is self-adhesive; and
   conductive metal vias formed in said through holes for electrically connecting said first and second metal layers to one or more particular leads, respectively, among said plurality of lead lines.

9. A multi-layer lead frame as set forth in claim 8 wherein said first and second connector films are formed of polyimide.

10. A multi-layer lead frame as set forth in claim 8 wherein at least one of said first and second connector films is self-adhesive upon application of heat and pressure.

* * * * *

UNITED STATES PATENT AND TRADEMARK OFFICE
CERTIFICATE OF CORRECTION

PATENT NO. : 5,399,809
DATED : March 21, 1995
INVENTOR(S) : Takenouchi

It is certified that error appears in the above-indentified patent and that said Letters Patent is hereby corrected as shown below:

Col. 3, line 9, change "nicked" to --nickel--.

Signed and Sealed this

Eleventh Day of July, 1995

Attest:

BRUCE LEHMAN

*Attesting Officer*    *Commissioner of Patents and Trademarks*